United States Patent [19]
Dennard et al.

[11] Patent Number: 5,198,995
[45] Date of Patent: Mar. 30, 1993

[54] TRENCH-CAPACITOR-ONE-TRANSISTOR STORAGE CELL AND ARRAY FOR DYNAMIC RANDOM ACCESS MEMORIES

[75] Inventors: Robert H. Dennard, Peekskill; Nicky C. Lu, Yorktown Heights, both of N.Y.

[73] Assignee: International Business Machines Corporation, Armonk, N.Y.

[21] Appl. No.: 605,892

[22] Filed: Oct. 30, 1990

[51] Int. Cl.$^5$ .................... G11C 11/34; H01L 29/78
[52] U.S. Cl. .................... 365/149; 365/203; 257/301
[58] Field of Search ............ 365/149, 203, 233, 154, 365/156; 357/23.6

[56] References Cited

U.S. PATENT DOCUMENTS

| | | | |
|---|---|---|---|
| 4,649,625 | 3/1987 | Lu | 29/571 |
| 4,651,184 | 3/1987 | Malhi | 357/23.6 |
| 4,673,962 | 6/1987 | Chatterjee et al. | 357/23.6 |
| 4,683,486 | 7/1987 | Chatterjee | 357/23.6 |
| 4,688,063 | 8/1987 | Le et al. | 357/23.6 |
| 4,728,623 | 3/1988 | Lu et al. | 357/23.6 X |
| 4,833,516 | 5/1989 | Hwang et al. | 357/23.6 |

FOREIGN PATENT DOCUMENTS

| | | |
|---|---|---|
| 61-79252 | 4/1986 | Japan . |
| 61-145853 | 7/1986 | Japan . |
| 61-285752 | 12/1986 | Japan . |
| 62-040759 | 2/1987 | Japan . |

OTHER PUBLICATIONS

IBM Technical Disclosure Bulletin, vol. 27, No. 11, Apr. 1985 pp. 6694–6697 D. Chin et al. "Dynamic RAM Cell with Merged Drain and Source".

IBM Technical Disclosure Bulletin, vol. 29, No. 5, Oct. 1986 pp. 2335–2340 Hwang et al. "High Density Vertical DRAM Cell".

Trench Capacitor Cell with Double Diffused Structure for Megabit Dynamic RAMS by Yoneda et al. Japan Soc. Appl. Phys. Tokyo Japan 1986 Sym on VLSI.

"Submicron CMOS Technologies for Four Mega Bit Dynamic RAM" by H. Ishiuchi et al., IEEE, New York International Electron Devices Meeting Tech. Dig. Washington D.C., Dec. 1–Apr 1985 pp. 706–709.

"High-Speed Sensing Scheme for CMOS DRAM's" by S. H. Dhong et al., IEEE Journal of Solid State Circuits, vol. 23, No. 1 Feb. 1988 pp. 34–40.

"Offset Word-line Architecture for Scaling DRAM's to the Gigabit Level" by R. E. Scheuerlein et al., IEEE Journal of Solid State Circuits vol. 23, No. 1 Feb. 1988 pp. 41–47.

*Primary Examiner*—Joseph A. Popek
*Attorney, Agent, or Firm*—John J. Goodwin; C. B. Lobsenz

[57] ABSTRACT

Lightly Depleted PMOS (LDP) substrate-plate trench-capacitor (SPT) cell Array architecture is disclosed including three types of devices: An enhancement NMOS transistor (ENMOS) which has a n+ poly gate with a positive threshold voltage range, an enhancement PMOS transistor (EPMOS) having a p+ poly gate with a negative threshold voltage range, and a lightly depleted PMOS transistor (LDPMOS) having a p+ poly gate. The LDPMOS is used as the access transistor in the SPT cell with body biased at the power supply voltage VDD, and can also be used in the write drivers. A sense amplifier is included which is a CMOS cross-coupled latch. An n-well is biased at a lower voltage than VDD, such as (VDD—Vg) where Vg is the silicon bandgap, and the lower thresholds enhance faster sensing. The CMOS cross-coupled latch is activated by turning on latching devices. The bitlines are prevented from charging to greater than VDD—Vg, which could cause the array devices of unselected cells to conduct current and alter the stored low-voltage state of such cells.

8 Claims, 3 Drawing Sheets

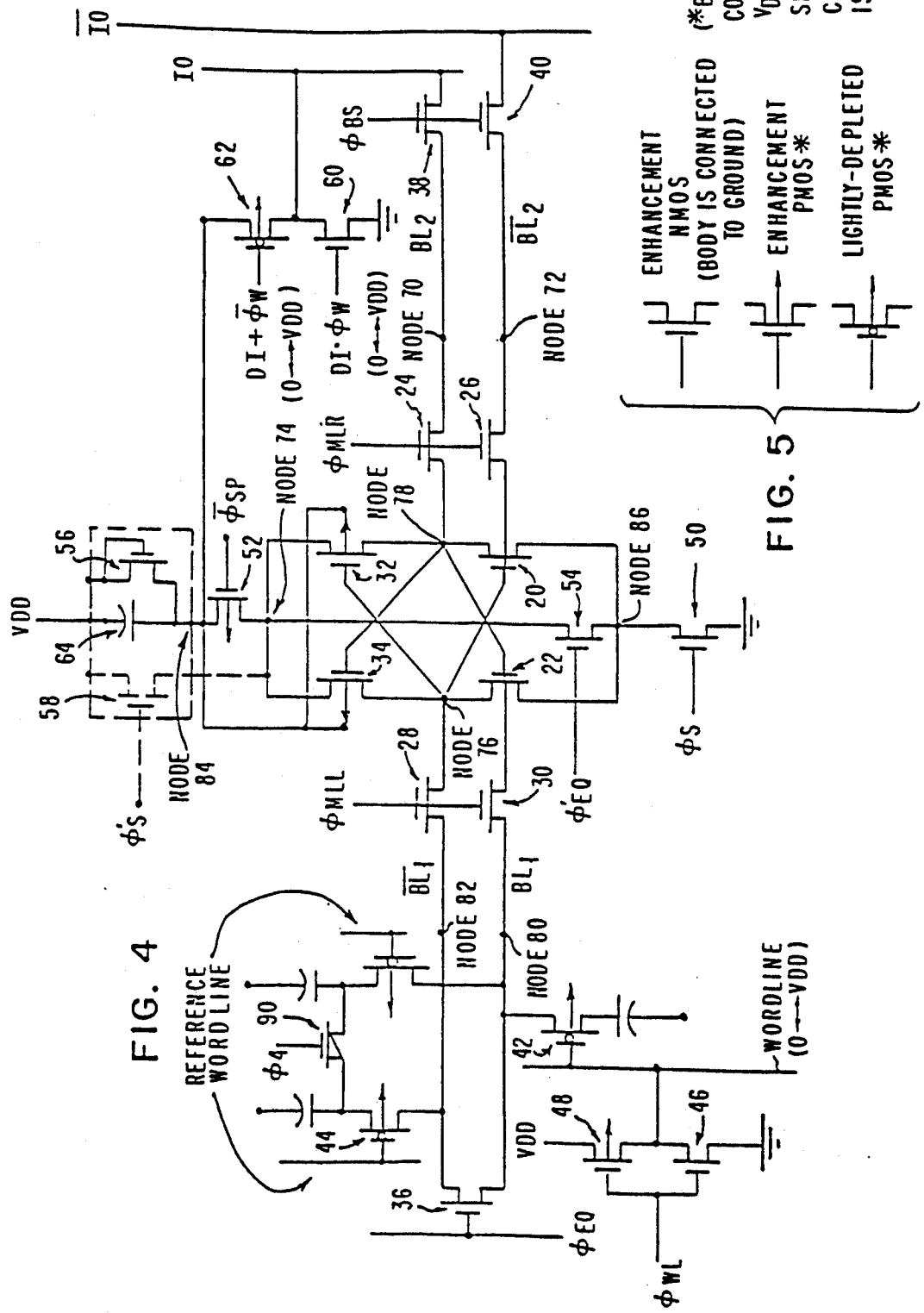

TRENCH-CAPACITOR-ONE-TRANSISTOR STORAGE CELL AND ARRAY FOR DYNAMIC RANDOM ACCESS MEMORIES

BACKGROUND OF THE INVENTION

1. Field of the Invention

The present invention relates to dynamic random access memory (DRAM) cell structures of the type including storage cells having an access transistor and a storage trench capacitor, and the memory array designs using these cells.

2. Description of the Prior Art

U.S. Pat. No. 4,651,184 issued Mar. 17, 1987, to Malhi and entitled DRAM CELL AND ARRAY describes a DRAM cell and array of cells, together with a method of fabrication, wherein the cell includes one field effect transistor and one capacitor with both the transistor and the capacitor formed in a trench in a substrate. One capacitor plate and the transistor source are common and are formed in the lower portion of the trench sidewall. The transistor drain is formed in the upper portion of the trench sidewall to connect to a bitline on the substrate surface, and the channel is the vertical portion of the trench sidewall between the source and drain. A ground line runs past the transistor gate in the upper portion of the trench down into the lower portion of the trench to form the other capacitor plate.

U.S. Pat. No. 4,673,962 issued Jun. 16, 1987, to Chatterjee et al. and entitled VERTICAL DRAM CELL AND METHOD discloses DRAM cells and arrays of cells on a semiconductor substrate, together with methods of fabrication, wherein the cells are formed in pairs or quartets by excavating a trench or two trenches through the cell elements to split an original cell into two or four cells during the fabrication. The cells include vertical field effect transistors and capacitors along the trench sidewalls with wordlines and/or bitlines crossing over the cells.

U.S. Pat. No. 4,683,486 issued Jul. 28, 1987, to Chatterjee and entitled DRAM CELL AND ARRAY discloses a DRAM cell and array of cells, together with a method of fabrication, wherein the cell includes one field effect transistor and one storage capacitor with both the transistor and the capacitor formed in a trench in a substrate. The transistor source, channel, and drain and one capacitor plate are formed in a layer of material inserted into the trench and insulated from the substrate; the gate and other capacitor plate are formed in the substrate trench sidewall. In preferred embodiments bitlines on the substrate surface connect to the inserted layer, and wordlines on the substrate surface are formed as diffusions in the substrate which also form the gate. The trenches and cells are formed in the crossings of bitlines and wordlines; the bitlines and the wordlines form perpendicular sets of parallel lines.

U.S. Pat. No. 4,649,625 issued Mar. 17, 1987, to Lu and entitled DYNAMIC MEMORY DEVICE HAVING A SINGLE-CRYSTAL TRANSISTOR ON A TRENCH CAPACITOR STRUCTURE AND A FABRICATION METHOD THEREFOR describes dynamic random access memory (DRAM) devices wherein individual cells, including an access transistor and a storage capacitor are formed on a single-crystal semiconductor chip, and more particularly a three-dimensional dynamic random access memory (DRAM) device structure is described having a single-crystal access transistor stacked on top of a trench capacitor and a fabrication method therefor wherein crystallization seeds are provided by the single-crystal semiconductor area surrounding the cell and/or from the vertical sidewalls of the trench and wherein the access transistor is isolated by insulator. In the structure, a trench is located in a p+type substrate containing heavily doped N+polysilicon. A composite film of $SiO_2$/$Si_3N_4$/$SiO_2$ is provided for the capacitor storage insulator. A thin layer of $SiO_2$ is disposed over the polysilicon. A lightly doped p-type epi silicon layer is located over the substrate and $SiO_2$ layer. The access transistor for the memory cell is located on top of the trench capacitor. An N+doped material connects the source region of the transistor to the polysilicon inside the trench. A medium doped p-region on top of the trench surface may be provided in case there is any significant amount of leakage current along the trench surface.

U.S. Pat. No. 4,688,063 issued Aug. 18, 1987 to Lu et al, and entitled DYNAMIC RAM CELL WITH MOS TRENCH CAPACITOR IN CMOS describes Dynamic Random Access Memory (DRAM) cells and more particularly relates to a DRAM cell wherein the storage capacitor of the cell is disposed in a trench formed in a semiconductor substrate wherein at least a portion of the substrate is heavily doped and forms the counterelectrode of the storage capacitor while a heavily doped polycrystalline plug disposed in the trench capacitor forms the other electrode of the storage capacitor. The DRAM cell includes a field effect access transistor disposed in a well which is opposite in conductivity type to that of the substrate. The well itself is formed in a lightly doped portion of the substrate and may be n or p-type conductivity with the other portions of the cell having conductivity types appropriate for devices fabricated in the CMOS environment. The trench capacitor extends from the surface of the well through the well and lightly doped substrate portion into the heavily doped portion of the substrate. The electrode disposed in the trench is directly connected to the source/drain of the access transistor.

U.S. Pat. No. 4,833,516 issued May 23, 1989 to Hwang et al entitled HIGH DENSITY MEMORY CELL STRUCTURE HAVING A VERTICAL TRENCH TRANSISTOR SELF-ALIGNED WITH A VERTICAL TRENCH CAPACITOR AND FABRICATION METHODS THEREFOR describes a high density vertical trench transistor and trench capacitor DRAM (dynamic-random-access memory) cell incorporating a wafer with a semiconductor substrate and an epitaxial layer thereon including a vertical transistor disposed in a shallow trench stacked above and self-aligned with a capacitor in a deep trench. The stacked vertical transistor has a channel partly on the horizontal surface and partly along the shallow trench sidewalls. The drain of the access transistor is a lightly-doped drain structure connected to a bitline element. The source of the transistor, located at the bottom of the transistor trench and on top of the center of the trench capacitor, is self-aligned and connected to polysilicon contained inside the trench capacitor. Three sidewalls of the access transistor are surrounded by thick oxide isolation and the remaining one side is connected to drain and bitline contacts. The memory cell is located inside an n-well and uses the n-well and heavily doped substrate as the capacitor counter-electrode plate. The cell storage node is the polysilicon inside the trench capacitor and includes steps for growing epitaxial layers wherein an opening is left which serves as the shallow trench access transistor region and provides self-alignment with the deep trench storage capacitor.

U.S. Pat. No. 4,728,623 issued Mar. 1, 1988 to Lu et al entitled FABRICATION METHOD FOR FORMING A SELF-ALIGNED CONTACT WINDOW AND CONNECTION IN AN EPITAXIAL LAYER AND DEVICE STRUCTURES EMPLOYING THE METHOD describes a fabrication process for providing an epitaxial layer on a silicon substrate and over predefined insulator-capped islands which forms a self-aligned contact window in the epitaxial layer.

Application of the method to a three-dimensional dynamic random access memory (DRAM) device structure is shown, with an access transistor formed in monocrystalline silicon stacked on top of a trench capacitor. A fabrication method therefor is shown wherein the contact window for the source-to-trench connection is formed by self-aligned lateral epitaxial growth, followed by a contact-connection formation step using either a second epitaxial growth or a CVD refill and strapping process. The invention can be further applied to other device structures using the described principles, and more specifically to an inverter structure having the driver device stacked over the load-resistor as another example, which can be used as a basic building circuit unit and static RAM cell.

Japanese Patent J62-040759 issued Feb. 21, 1987, and entitled SEMICONDUCTOR MEMORY describes a technique to further increase the capacity of a storage trench capacitor without increasing the size of a memory by increasing the center of a groove wider than the groove opening of a prescribed pattern.

Japanese Patent J61-285752 issued Dec. 16, 1986, and entitled SEMICONDUCTOR MEMORY DEVICE provides a structure for a memory cell optimized for a large capacity memory by providing a slant surface at the upper part of a groove, forming one transistor on the plane surface and forming one capacitor on the groove, thereby reducing the substantial plane area of the memory cell.

Japanese Patent J61-079252 issued Apr. 22, 1986, and entitled, MANUFACTURE OF SEMICONDUCTOR MEMORY DEVICE discloses a method to form a large capacitance having high withstanding voltage in a fine region for proving a DRAM having high performance by conducting the formation of a groove in a MOS capacitance region and the burying of a field insulating film through self-alignment without etching the silicon substrate.

Japanese Patent J61-145853 issued Jul. 3, 1986, and entitled SEMICONDUCTOR MEMORY DEVICE discloses a method for fabricating a trench capacitor wherein the entire face of the capacitor functions as a capacitance without reducing writing voltage. The trench capacitor is formed with an impurity-implanted region with a conductive type opposite to the semiconductor substrate.

The publication in the IBM Technical Disclosure Bulletin, Vol. 29, No. 5, October 1986, pp. 2335-2340, describes a high density vertical trench DRAM cell wherein the transfer device is oriented in the vertical direction and is positioned over the trench storage capacitor. A shallow trench filled with polysilicon or polycide serves as the MOS transfer device gate. Transfer MOSFETs of adjacent cells share the same gate.

Also see the publication in the IBM Technical Disclosure Bulletin, Vol. 27, No. 11, April 1985, pp. 6694-6697, which describes a one-transistor dynamic RAM cell requiring less surface area which is constructed by burying the cell storage capacitor beneath the drain.

The publication entitled, "Trench Capacitor Cell with Double Diffused Structure for Megabit Dynamic RAMS," by M. Yoneda, S. Satoh, H. Ozaki, M. Hirayama, M. Yamada and T. Yamazaki (*Japan Soc. Appl. Phys.*, Tokyo, Japan; 1986 Symposium on VLSI Technology, Digest of Technical Papers, San Diego, CA., May 28-30, 1986, pp. 77-78) states that as the pattern size of LSI DRAMs gets smaller, deeper trenches and smaller isolation widths are required. However, the trench structure without p+ diffusion has a scale down limitation because of the leakage between trench capacitor cells and large collection efficiency. A trench capacitor cell is proposed with double diffused structure that has the advantage of scaling down the pattern size by decreasing the depletion layer. It is promising for the realization of megabit dynamic RAMS.

The publication entitled, "Submicron CMOS Technologies for Four Megabit Dynamic RAM," by H. Ishichi, T. Watanabe, K. Kishi, M. Ishikawa, N. Goto, T. Tanaka, T. Mochizuki and O. Ozawa (*IEEE*, New York, N.Y.; International Electron Devices Meeting; Technical Digest, Washington, D.C., Dec. 1-4, 1985, pp. 706-709) teaches that submicron CMOS technologies have been developed for an experimental 4-Mb dynamic RAM. The main features are a trench capacitor cell, a triple poly single metal process, and a twin tub CMOS technology. The trench capacitor cells are formed in an optimized p well in order to prevent leakage current between adjacent trench capacitors and to reduce soft error rate. The minimum gate lengths of NMOS and PMOS transistor are 0.8 mu m and 1.2 mu m, respectively. The technologies have been verified using test vehicles and a 256 Kbit dynamic RAM chip.

The publication entitled "High-Speed Sensing Scheme for CMOS DRAM's" by S. H. Dhong, N. C-C. Lu, W. Hwang and S. A. Parke (IEEE Journal of Solid State Circuits, Vol. 23, No. 1, Feb. 1988, pp. 34-40), describes a sensing scheme for CMOS DRAM's wherein a significant improvement in sensing speed over the half-VDD bitline precharge sensing scheme is obtained by precharging the bitline to approximately ⅓-VDD. The ⅓-VDD sensing with a limited bitline swing has several unique advantages over the half-VDD sensing scheme such as a faster signal development time, reduced power consumption and smaller noise. Also it is particularly suitable for high-performance high-density CMOS DRAM's, where boosting the wordlines is difficult to achieve because of device reliability concerns in the scaled down devices.

The publication "Offset Word-Line Architecture for Scaling DRAM's to the Gigabit Level" by R.E. Scheuerlein and J.D. Meindl (IEEE Journal of Solid State Circuits, Vol. 23, No. 1, Feb. 1988 pp. 41-47) describes an alternate to the boosted wordline DRAM architecture which is scalable to the gigabit level and avoids the problems of poor performance and high gate fields of conventional boosted wordline circuits is described. The alternative is called an offset wordline architecture because the cell switch is changed to depletion mode and the wordline is pulled beyond the cell switch device's source voltage rather than boosted beyond its drain voltage.

SUMMARY OF THE INVENTION

An object of the present invention is to provide a new array architecture for high density DRAMs.

Another object of the present invention is to provide a DRAM memory cell which uses a substrate-plate trench capacitor type cell structure of the type described in U.S. Pat. No. 4,688,063 but having a lightly depleted PMOS access device with p+ poly gate.

Still another object of the present invention is to provide a DRAM memory cell with a reduced electric field or a higher stored charge for given electric field.

A further object of the present invention is to provide a DRAM memory cell wherein the high bitline swing is limited to a potential of about one silicon-bandgap voltage below VDD (the most positive voltage applied to the wordline).

Still another object of the present invention is to provide a DRAM structure wherein enhancement NMOS transistors are employed as multiplexing devices to share a sense amplifier between two segmented bitline pairs.

BRIEF DESCRIPTION OF THE DRAWINGS

FIG. 4 is a schematic illustration of the circuit diagram for the sensing circuits and arrays using lightly depleted PMOS access device structure according to the principles of the present invention.

FIG. 5 is a schematic illustration depicting the symbolic representation of the three transistor devices used in the embodiment of FIG. 4.

DESCRIPTION OF THE PREFERRED EMBODIMENT

Figure 1:
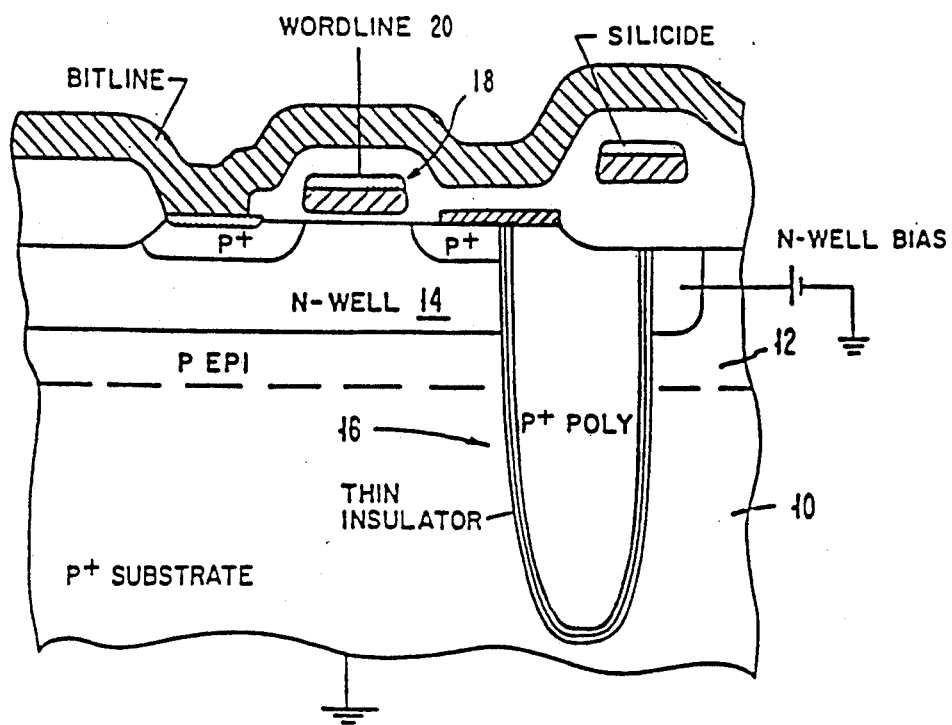
FIG. 1 is a schematic cross section illustration of an embodiment of a one-transistor substrate-plate memory cell structure known in the prior art.

The present invention uses a type of cell structure referred to as a substrate-plate trench-capacitor (SPT) memory cell and an embodiment of which is described in the publication by N.C.C. Lu et al., "A Substrate-Plate Trench-Capacitor (SPT) Memory Cell for Dynamic RAMs," *IEEE J. of Solid-State Circuits*, 21 (5), 1986, pp. 627-634. This SPT cell is illustrated in FIG. 1 which depicts a p+ semiconductor substrate 10 having a p epitaxial layer 12 thereon with an n-well 14 therein. A deep trench capacitor 16 filled with heavily doped p+ polysilicon is disposed in the well, epi layer and substrate.

A PMOS access device 18 including an n+ polysilicon gate 20 as well as source and drain electrodes, isolation regions and bitline and wordline connectors is also shown connected to the trench capacitor.

The SPT cell described in the Lu et al publication and illustrated in FIG. 1 is highly useful for 4 Mb DRAMs because of its features of small area, high capacitance, low leakage current and soft error rate, reduced surface topography, and a very stable capacitor plate electrode. The cell area is 10.6 $\mu m^2$ with 0.7 $\mu m$ minimum features in 4 Mb DRAMs.

Figure 2:
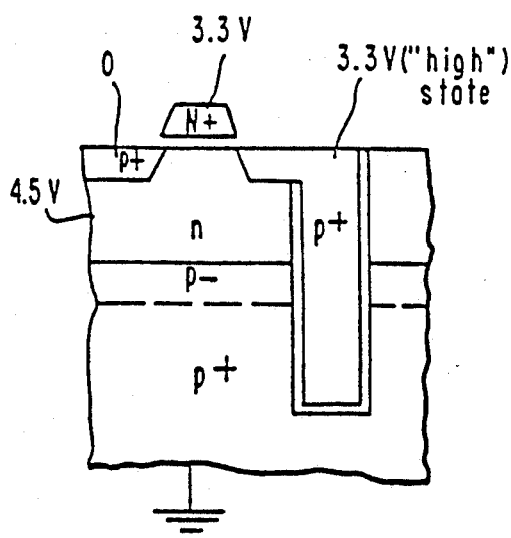
FIG. 2 illustrates a schematic cross section of an enhancement PMOS access device in the substrate-plate memory cell structure of FIG. 1.

To extend the technology beyond 4 Mb, the cell size needs to be scaled down. A consequence is that the cell has small storage capacitance providing an insufficient sensing signal, unless a much deeper trench capacitor is used, which is difficult to implement and can degrade the yield. This storage-signal inadequacy is mainly due to two reasons. First, in order to relax the stress over devices as device dimensions are scaled down, the unboosted wordline is most likely to be used. It is difficult to boost the wordline significantly below ground, such as $-1.5$ V, while maintaining the required performance with the existing cell structure/technology. If an NMOS device were used as a boosted wordline driver, the negative boosted wordline level would forward bias the n+/p junction, which would cause minority-carrier injection and thus induce circuit malfunction. If a PMOS device were used as a boosted wordline driver, in order to boost the wordline to $-1.5$ V within reasonable time, the gate voltage of the PMOS must be boosted to almost $-3$ or $-4$ V. This gives the following problems: (1) poor performance since this PMOS driver is operated in the source-follower mode, and (2) the voltage across the device junctions is high. As a result, if the wordline boosting is not used, the SPT cell stores either VDD (e.g., 3.3 V) or a voltage greater than $|VT|$ of the access device (e.g., about $-1.5$ V under nominal conditions). The highest stress on the storage insulator occurs between the grounded substrate and the storage node while the cell stores VDD (this is illustrated in FIG. 2). However, the amount of differential storage voltage which can be used for sensing is only (VDD $-1.5$) rather than VDD. The maximum stress on the PMOS gate oxide occurs while the device is turned off. When an n+ poly gate is used for the PMOS access device, the maximum gate stress is not only VDD but has an additional silicon bandgap voltage Vg ($\simeq 1.1$ V) due to the work-function difference between device gate and drain. As a result, scaling of the gate oxide thickness is limited, which can cause difficulties in prevention from both the short channel effect and the subthreshold leakage as the channel length is scaled down. On the other hand, increasing the bit density from 4 Mb to 16 Mb and beyond calls for more bits on the bitlines, resulting in a higher bitline capacitance. Higher bitline capacitance plus diminished cell capacitance as mentioned above degrade both sensing signal and performance. In order to reduce the bitline capacitance and leakage in the cell, an n-well bias (e.g., 1.2 V above VDD) needs to be applied to the array substrate must be generated on the chip and, which can introduce extra noises to degrade the total sensing signal. In order to solve these problems, a new array/cell architecture is described herein which not only optimizes the storage charge of the SPT cell, but also enhances both the sensing signal and performance.

Figure 3:
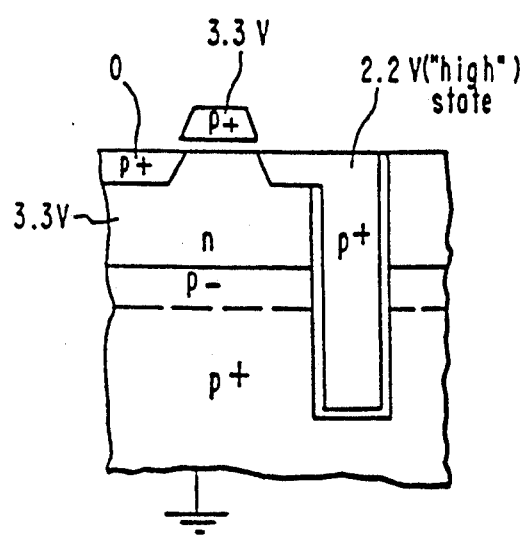
FIG. 3 is a schematic cross section illustration of a lightly depleted PMOS access device with the substrate-plate trench-capacitor memory cell optimized in accordance with the principles of the present invention.

FIG. 3 illustrates an optimized p+ −gate SPT cell wherein a voltage lower than VDD is utilized from the cell storage for sensing, but the same amount of voltage is stressed over the storage insulator.

This lower voltage across the storage insulator permits the storage insulator to be scaled down to maximize the stored charge in the cell.

FIG. 4 shows the circuit schematic for the Lightly Depleted PMOS SPT cell Array (LDPA) architecture of the present invention. It consists of three types of devices as depicted in FIG. 5: an enhancement NMOS transistor (ENMOS) which has the n+ poly gate with VT ranging from 0.5 to 0.8 V including the body effect, an enhancement PMOS transistor (EPMOS) having a p+ poly gate with VT of −0.5 to −0.8 V, and a lightly depleted PMOS transistor (LDPMOS) having a p+ poly gate with a threshold voltage VT* of 0 to 0.4 V. This is approximately the same device used in the prior art implementation of FIG. 2 except for the change in gate doping from n+ to p+ which shifts the threshold by the amount of the silicon bandgap Vg, (∼1.1 V). The LDPMOS is used as the access transistor in the SPT cell with body biased at VDD, such devices 42 and 44 in FIG. 4, and can also be used in the write drivers such as device 62. The sense amplifier is a CMOS cross-coupled latch including devices 20, 22, 32 and 34. The n-well where devices 32 and 34 are located is biased at (VDD−Vg) instead of VDD, and so the lower thresholds of these two devices help faster sensing. The CMOS cross-coupled latch is activated by turning on latching devices 50 and 52. The other difference from the conventional design is that the voltage supply to device 52 is regulated to a potential which is about one silicon bandgap Vg(≃1.1 V) lower than VDD. The purpose of this is to prevent charging the bitlines to greater than VDD−Vg, which could cause the array devices of unselected cells to conduct current and alter the stored low-voltage state of such cells. The voltage regulation can be done in different ways, and FIG. 4 shows an exemplary circuit consisting of devices 56, 58 and 64. At initial sensing, the sense amplifier is shared by two bitline pairs, BL1 and BL1, as well as BL2 and BL2, by multiplexing through the ENMOS devices 24, 26, 28 and 30. The difference from the conventional design that uses either depletion NMOS or ENMOS with gate voltages bootstrapped above VDD is that here ENMOS devices are used without bootstrapping the gate voltage above VDD. Since the high bitline is pulled up to (VDD−Vg), there is sufficient overdrive to transfer the signal through these multiplexing devices. The rest of the circuits such as bitline equalization device 36, wordline drivers 46 and 48, and column switches 40 and 38 are the same as in the conventional design.

The operation of the circuit is described in the following. At the end of the previous active cycle, both ΦMLL and ΦMLR clocks and unselected wordlines are high at VDD (e.g., 3.3 V), and one bitline is at 0 V and the other is at VDD−Vg (≃2.2 V), that is, the regulated voltage on the node 84. Because LDPMOS is used for the access device, when the previously active wordline is at 0 V, the cells store either 2.2 V for the "high" or 0 V for the "low" signal. The restore is completed when the wordline is pulled up to VDD through the PMOS 48 in the wordline driver. The difference Vg between VDD on the wordline and (VDD−Vg) on the high bitlines turns off the LDPMOS access devices with sufficient noise immunity. Then a precharge of the bitline before sensing is initiated by activating ΦEQ to turn on the equalization device 36. The charge sharing between the two complementary bitlines results in the precharge level of nearly (VDD−Vg)/2 which is about 1.1 V. The reference voltage established on a full-size reference cell is obtained by activating Φ4 to turn on device 90 for charge sharing between two reference cells, one having a stored high and the other a stored low. Since the half-(VDD−Vg) sensing is used, these reference cells are not mandatory. READ can be performed by selecting the wordline and the reference wordline, which establishes a differential signal on the two sensing nodes of the CMOS cross-coupled pair. The worst-case charge transfer is to read a stored "0", which starts after the wordline level is pulled down to (VDD−Vg)/2, and the stored charge is fully transferred to the bitline without threshold loss because the LDPMOS is used for the access device. Also, sufficient overdrive exists without wordline boosting, which achieves as fast sensing as the (½)VDD-precharged bitline sensing scheme as described in the afore-said S. Dhong et al of IEEE publication. As mentioned before, in order to reduce the number of sense amplifiers and decrease bitline capacitance before sensing, a shared sense-amplifier is located at the center to segment the long bitline into two halves. Depending on whether the selected cell is on the side of BL1 or BL2, either ΦMLR or ΦMLL (which is high at standby) is pulled down to low for momentarily decoupling the bitline capacitance of either BL2 or BL1, respectively. Because the high bitline voltage is only pulled up to (VDD−Vg), when devices 24, 26, 28 and 30 are turned on with their gate voltages at VDD, there is sufficient overdrive on these devices to pass through the "high" voltage. This is superior to the conventional design in which a high bitline needs to be pulled up to VDD, where the multiplexing devices have to be either depletion devices or enhancement devices with the gate voltage bootstrapped higher than VDD for acquiring sufficient overdrive. To amplify the signal, the NMOS cross-coupled pair (20 and 22) and the PMOS cross-coupled pair (32 and 34) are switched on by Φs and its complementary signal Φsp and delayed signal Φs', respectively. Since the n-well where devices 32 and 34 are located is biased at (VDD−Vg) instead of VDD, the lower thresholds of these two devices allow faster sensing. At standby the node 84 is precharged to (VDD−Vg) through a diode 56 (or some equivalent voltage regulating scheme). An on-chip capacitance 64 is used to provide the charge for reducing the momentary dip of the voltage at node 84 when device 52 is switched on. Then device 58 with its threshold about Vg is switched on by Φs' to stabilize the voltage at node 74 around (VDD−Vg). The circuit using devices 56, 58 and 64 is not the only circuit to achieve the desired voltage regulation, for which other voltage converters can be used. Since bitlines are pulled up to (VDD−Vg) and down to ground respectively from a standby level of (VDD−Vg)/2, a balanced bitline swing results, which achieves all the advantages of the conventional half-VDD sensing with even less noise and power because of the smaller voltage swings. After the differential sensing signal is slightly amplified, both ΦMLR and ΦMLL are pulled up to VDD such that a sufficiently large signal is developed across the bitlines before turning on column switches 38 and 40 for the signal development on the I/O bus. All circuits associated with the I/O bus, such as I/O sense amplifiers and write drivers, can use the similar circuit techniques of limiting the high swing to (VDD−Vg), e.g., the write driver circuit consisting of devices 60 and 62 shown in FIG. 4. On the other hand, these I/O related circuits can also be designed to have a high swing to VDD. The voltage which is fed onto the bitlines from the I/O bus can still be limited to about (VDD−Vg) due to the threshold voltage drop because of the column switch devices 38 and 40.

Figure 6:
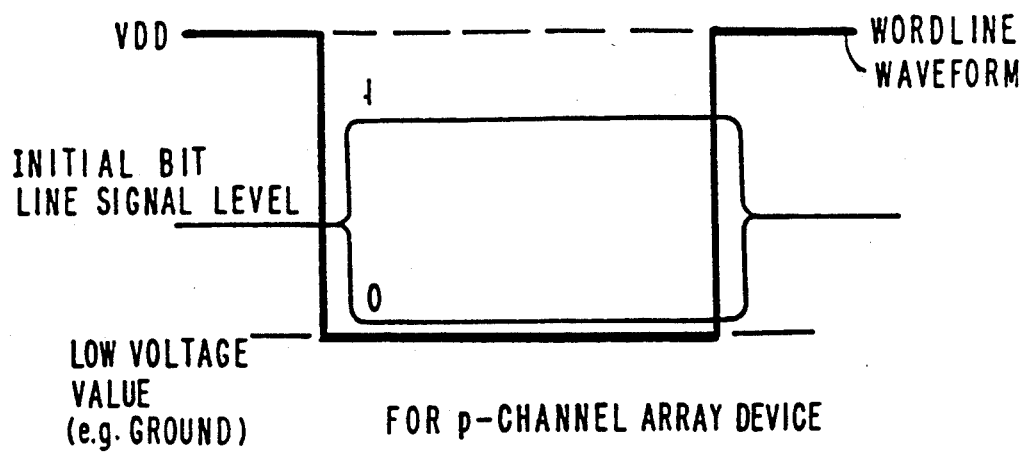
FIG. 6 is a schematic illustration of a waveform illustrating the wordline and bitline voltages for a p-channel array device embodiment.

In FIG. 6, it is illustrated that for an embodiment of the invention using p-channel array devices, the wordline connected to the gate electrode of the access transistor has an unselected voltage thereon of VDD which decreases to a low voltage value when the wordline is selected.

Thereafter, the bitline, which was at an initial value below VDD, goes to a different voltage value which is a voltage increase in the case of a "1" bit or a voltage decrease in the case of an "0" bit. In either case, the different value of the bitline is always less than VDD.

Figure 7:
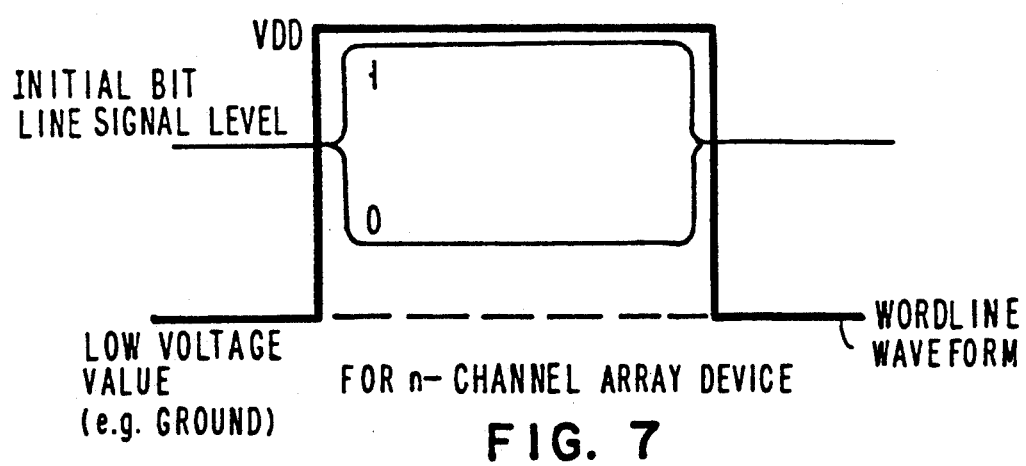
FIG. 7 is a schematic illustration of a waveform illustrating the wordline and bitline voltages for an n-channel array device embodiment.

FIG. 7 is a similar waveform for the embodiment of the invention using n-channel array devices, so it can be seen that the n-channel embodiment is a straightforward equivalent of the p-channel embodiment.

The LDPA architecture of the present invention offers several improvements over the prior art SPT cell array architecture. The conventional SPT cell/array design with unboosted wordlines uses a differential voltage about (VDD−1.5 V) from cells for sensing, but has a maximum stress of VDD over the storage insulator (FIG. 2), thus limiting scaling of the storage insulator thickness and also resulting in the sensing signal not being optimized. By employing boosting of the wordlines, the differential voltage from the cells for sensing could be VDD; but a higher gate-to-drain voltage of (VDD+VT) or larger would be applied across the access device. Also, boosting of wordlines is difficult to achieve because of low boosting efficiency at a reduced wordline pitch and giving slow speed. In the LDPA array of the present invention, the SPT cell storage for sensing is optimized. A voltage of (VDD−Vg) is utilized from the cell storage for sensing, and the same maximum voltage is stressed over the storage insulator (FIG. 3). As a result, the storage insulator thickness can be scaled down to maximize the stored charge in the cell.

By using p+ poly gates on the PMOS transistors as compared to n+ poly gates, the maximum voltage stress over the thin gate oxide is reduced in the turned-off condition (FIG. 3). Consequently, the gate oxide thickness can be scaled down such that both PMOS and NMOS devices can have better short channel behavior, leading to a faster design.

For the SPT cell in the LDPA array of the present invention, the maximum drain-to-source voltage across the access device is (VDD−Vg) instead of VDD in the prior art. This reduces the subthreshold leakage and possible punchthrough effects in the access device, allowing either shorter channel length or lower VT design. Also, the depletion region widths between junctions are reduced within the cell array, which can effectively result in tighter design rules.

In the prior art SPT cell/array, since the high bitline and the storage node can be both pulled up to VDD, an n-well array bias higher than VDD is needed and generated on the chip to avoid any transient junction forward-biasing to inject minority carriers. In the LDPA array of the present invention, a VDD n-well bias can be used because the potentials of both the high bitline and the storage node are limited to (VDD−Vg). As a result, the noise concerns due to an on-chip n-well array bias generator do not exist.

In order to achieve bitline segmentation, the LDPA array approach can use enhancement NMOS devices without bootstrapping the gate voltage to multiplex sense amplifiers. There is no need for using extra depletion devices or enhancement devices with their gate voltage bootstrapped over VDD. The multiplexing of sense amplifiers reduces the bitline capacitance connected to the sense amplifier, which results in a larger sense signal or requires less stored charge in the memory cells for a given sense signal.

Thus, a new LDPA array architecture and associated SPT cell have been described, which are especially useful for high-density DRAMs employing SPT-type cell structures. A lightly depleted PMOS transistor with p+ poly gate is used for the access device in the SPT cell. The wordline voltages swing between VDD and ground but the bitline voltage swings are limited to ground and (VDD−Vg) where Vg is about one silicon bandgap voltage. This reduces the stored high-voltage level in the SPT cell capacitor such that the storage insulator thickness can be scaled down to enhance the storage charge capacity. Also, the sensing is less noisy with smaller peak current because of reduced bitline swings. Furthermore, the sense amplifier can be multiplexed with normal enhancement NMOS devices without bootstrapping the gate voltage over VDD or using depletion NMOS as required in the conventional array approach. The CMOS write driver uses a LDPMOS pullup with (VDD−Vg) on its source to result in smaller voltage swing without a speed trade-off. To enhance the CMOS sense-amplifier speed, a PMOS cross-coupled latch 32 and 34 uses a reduced n-well bias (VDD−Vg) to lower the device thresholds. All these features are unique for the LDPA array, which results in approximately doubling the sensing signal, allowing thinner gate oxide for higher device performance, optimizing the SPT cell charge storage, faster signal development, and lower sensing noise and active power.

Having thus described our invention, what we claim as new, and desire to secure by Letters Patent is:

1. A dynamic random access memory cell array comprising:
 a p-type doped substrate, the upper portion of said substrate being lightly doped and the lower portion being heavily doped, said upper lightly doped portion being less conductive than said heavily doped lower portion,
 a n-type doped well region disposed in said upper portion of said substrate,
 means for applying a bias voltage to said well region,
 means connected to said n-type doped well region for providing a positive voltage level of VDD above ground potential,
 at least one storage means extending from the surface of said well region, through said well region and said upper substrate portion and into said highly conductive lower substrate portion, said storage means being electrically isolated from said well region and said upper and lower substrate portions,
 at least one p-type MOS access transistor device having a gate electrode and further including a source region and a drain region disposed in said well region, said source and drain regions being heavily doped with first conductivity type impurities,
 said access transistor having a threshold voltage of substantially zero or a value greater than zero,
 at least one wordline, said wordline connected to said gate electrode of said access transistor, at least one bitline, said bitline connected to one of said access transistor source and drain regions disposed in said well region, said wordline connected to said gate electrode of said access transistor having an unselected voltage value thereon of VDD which decreases to a low voltage value when said wordline is selected, and said bitline having an initial signal level value thereon which is less than VDD and greater than said low voltage wordline value, wherein said initial signal level value on said bitline changes to a different level value in response to said wordline being selected, said different level of said bitline being lower in value than VDD.

2. A dynamic random access memory cell array according to claim 1 wherein said means for providing a positive voltage level of VDD above ground potential is an external power supply.

3. A dynamic random access memory cell array according to claim 2 wherein said gate electrode of said access transistor is composed of heavily p-type doped polysilicon.

4. A dynamic random access memory cell array according to claim 2 wherein said initial signal level value on said bitline increases to a second value less than VDD in response to a first selected memory storage state, and wherein said initial signal level value on said bitline decreases to a third value less than VDD in response to a second selected memory storage state.

5. A dynamic random access memory cell array according to claim 2 including at least two access transistor devices, at least two wordlines, two bitline pairs each having first and second bitlines, first and second of said access transistor devices having their said gates connected to separate ones of said at least two wordlines, said first and second of said access transistor devices having their said drain regions connected to separate ones of said first and second bitlines of one of said bitline pairs at first and second nodes respectively, a cross-coupled latch circuit connected to said at least two bitline pairs, said cross-coupled latch circuit including first and second transistor latch devices having gates connected to said first bitline of a first one of said bitline pairs at a third node, and third and fourth transistor latch devices having gates connected to a first bitline of a second one of said bitline pairs at a fourth node, said cross-coupled latch circuit being response to latch activating signals to become latched in one of two latch conditions, first and second latch activating transistor devices for providing latch activating signals, said first latch activating transistor device being connected between a source of regulated voltage having a value less than VDD and said second and fourth latch transistor devices of said cross-coupled latch, said second latch activating transistor device being connected between said first and third latch transistor devices of said cross-coupled latch and ground potential GND, a pair of first and second input/output lines, said first one of said input/output lines connected to a first column switch device which is connected to said first bitline of said second one of said bitline pairs at a fifth node and said second one of said input/output lines connected to a second column switch device which is connected to said second bitline of said second one of said bitline pairs at a sixth node, a first multiplexing transistor device connected to said first bitline of said first bitline pair between said second and third nodes, a second multiplexing transistor device connecting said second bitline of said first bitline pair between said first node and said gate electrode of said third transistor latch device, a third multiplexing transistor device connected to said first bitline of said second bitline pair between said fourth and fifth nodes, and a fourth multiplexing transistor device connected to said second bitline of said second bitline pair between said sixth node and said gate electrode of said first transistor latch device and, an equalization transistor device connected to said first and second bitlines in said first bitline pair at said first and second nodes.

6. A dynamic random access memory cell array according to claim 5 wherein said first and second access transistor devices are lightly-depleted first conductivity type silicon MOS devices having first conductivity type gate electrodes, said first and third transistor latch devices are enhancement first conductivity silicon MOS devices and said second and fourth transistor latch devices are enhancement opposite conductivity silicon MOS devices.

7. A dynamic random access memory cell array according to claim 6 further including a clock means for providing at least a first multiplexing signal $\Phi$MLL connected to the gate electrodes of said first and second multiplexing transistor devices and a second multiplexing signal $\Phi$MLR connected to the gate electrodes of said third and fourth transistor devices;

said clock means also providing complementary latching clock signals $\Phi$s and $\Phi$sp coupled to the gates of said first and second latch activating transistor devices, respectively, for turning on said latch activating transistors to activate said cross-coupled latch circuit, said clock means also providing clock signal $\Phi$EQ coupled to said equalization transistor device, for turning on said equalization transistor device for precharging said bitline paris to a level approximately $$\frac{VDD - V_g}{2}$$

wherein silicon has a bandgap value Vg.

8. A dynamic random access memory cell array according to claim 7 wherein said clock signals are providing in a cycle mode, at the beginning of said cycle mode said $\Phi$MLL and $\Phi$LR clock signals are high at voltage VDD, one of said bitlines is at zero voltage and the other of said bitlines is at VDD−Vg, and wherein said $\Phi$EQ is provided to precharge said bitlines to a $$\frac{VDD - V_g}{2},$$

and wherein said $\Phi$s and $\overline{\Phi\text{sp}}$ complementary latching clock signals are provided to latch said cross-coupled latch circuit into one of said two latch conditions.

* * * * *